United States Patent [19]

Porter

[11] Patent Number: 4,798,541

[45] Date of Patent: Jan. 17, 1989

[54] RIGHT ANGLE ELECTRICAL CONNECTOR

[75] Inventor: Warren W. Porter, Escondido, Calif.

[73] Assignee: NCR Corporation, Dayton, Ohio

[21] Appl. No.: 92,860

[22] Filed: Sep. 2, 1987

[51] Int. Cl.[4] .................... H05K 1/00

[52] U.S. Cl. .................... 439/67; 439/77; 439/493; 439/499

[58] Field of Search .................... 439/59, 61, 65, 66, 439/67, 74, 77, 90, 91, 927, 492, 493, 496, 497, 499

[56] References Cited

U.S. PATENT DOCUMENTS

| | | | |
|---|---|---|---|
| 3,614,707 | 10/1971 | Kaufmann et al. | 439/67 |
| 3,825,878 | 7/1974 | Finger et al. | 439/493 |
| 4,227,767 | 10/1980 | Mouissie | 439/493 |
| 4,552,420 | 11/1985 | Eigenbrode | 439/67 |
| 4,639,057 | 1/1987 | Daum | 339/17 |
| 4,693,529 | 9/1987 | Stillie | 439/67 |

*Primary Examiner*—David Pirlot

*Attorney, Agent, or Firm*—Wilbert Hawk, Jr.; Edward Dugas; Floyd A. Gonzalez

[57] ABSTRACT

A right angle connector which can be added to connector pads pre-existing on a mother board easily and inexpensively to accept a daughter board at any time for system enhancement. The right angle connection is also inexpensively manufactured and installed. The connector includes a slotted housing, a slotted elastomeric member, and a flexible circuit with numerous conductors. The flexible circuit is wrapped around the elastomeric member with its two free ends ending in the slot of the elastomeric member and these components are then inserted into the housing. The elastomeric member is a little bit larger than the enclosed volume of the housing when it is mounted by fasteners to the mother board. Thus, as the housing is fastened to the mother board, the elastomeric member is compressed causing it to make a better electrical contact between the electrical contacts of the mother board and the electrical contacts of the daughter board.

9 Claims, 3 Drawing Sheets

RIGHT ANGLE ELECTRICAL CONNECTOR

BACKGROUND OF THE INVENTION

The present invention is related to right angle electrical connectors, and is more particularly related to right angle electrical connectors for making multiple electrical connections between a daughter board and a mother board.

U.S. Pat. No. 3,795,884 issued Mar. 5, 1974 to Kotaka for "Electrical Connector Formed From Coil Spring" discloses a connector for connecting conductors on printed circuit boards using conductors formed from an axial cut spring. FIG. 8 shows a plurality of the patented connectors for making right angle connections between a mother board and a plurality of daughter boards.

U.S. Pat. No. 3,924,915 issued Dec. 9, 1975 to Conrad for "Electrical Connector" discloses an electrical connector having a body member, a sheet of flexible insulative material formed around the body member, a series of contact members on the outer face of the insulative material, and resilient means for urging the insulative material away from the body member.

U.S. Pat. No. 4,517,625 issued May 14, 1985 to Frink et al. for "Circuit Board Housing With Zero Insertion Force Connector" discloses a circuit board housing for electrically coupling at least one circuit board to a mother board. A flexible insulation layer is formed around a pair of pad members and a resilient member. The edge of a circuit board is placed between the pad members, and a pair of jaws clamp the pad members into engagement with the circuit board. The resilient member is rotatable from a first position which is not in engagement with the mother board, to a second position which is in engagement with the mother board. Electrical conductors on the insulation layer provide electrical connections between the circuit board and the mother board.

U.S. Pat. No. 4,528,530 issued July 9, 1985 to Ketchen for "Low Temperature Electronic Package having a Superconductive Interposer for Interconnecting Strip Type Circuits" discloses a right angle connector for making right angle electrical connections between vertical substrates and a horizontal substrate.

U.S. Pat. No. 4,581,495 issued Apr. 8, 1986 to Geri et al. for "Modular Telephone Housing" discloses the use of a length of flat cable for making electrical connections in a telephone housing.

U.S. Pat. No. 4,587,596 issued May 6, 1986 to Bunnell for "High Density Mother/Daughter Circuit Board Connector" discloses the use of a multi-layer flexible circuit folded around a housing member to make electrical connections with contact buttons formed on mother and daughter boards in a right angle configuration.

SUMMARY OF THE INVENTION

It is an object of the present invention to provide a right angle connector for connecting a mother board to a daughter board including a housing defining at least one chamber and having a slot therein communicating with the chamber, an elastomeric member having a slot in register with the slot of the housing located within the chamber and a portion extending out of the chamber, a flexible or flex circuit folded around the elastomeric member having its free ends located in the slot of the elastomeric member such that electrical contact is made between the edge connector pads on the daughter board inserted into the slots and the conductors on the flexible circuit; and electrical contact is made between the connector pads of the mother board and the portion of the flexible circuit extending from the housing as the housing is fastened to the mother board compressing the elastomeric member making a tight engagement therebetween.

It is another object of the present invention to provide a right angle connector which does not have to be fastened to a mother board until electrical connections are to be made to a daughter board.

It is another object of the present invention to provide a connector which may make electrical connections between an electrical circuit on one side of a daughter board with a first electrical circuit on the mother board, and which may make electrical connections with an electrical circuit on the other side of the daughter board with a separate second electrical circuit on the mother board.

These and other objects of the present invention will become apparent from the drawings and description of the preferred embodiment disclosed herein.

DESCRIPTION OF THE PREFERRED EMBODIMENT

Figure 1:
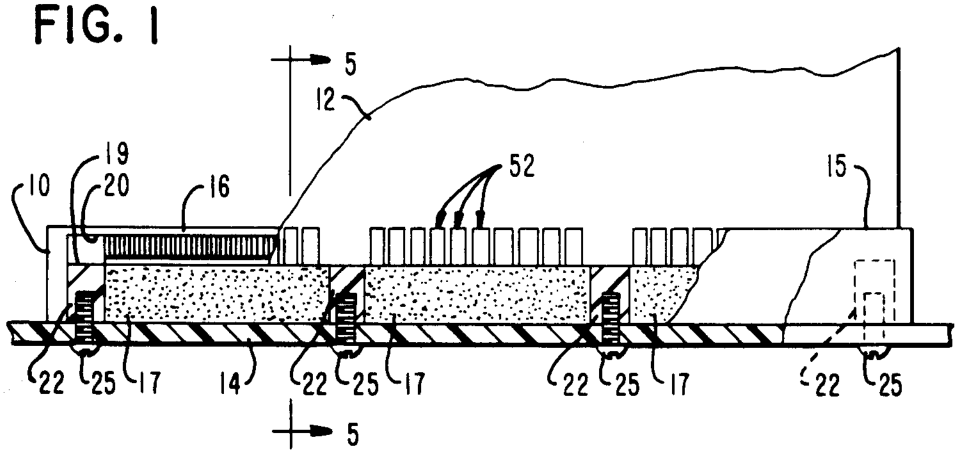
FIG. 1 is a side view of a daughter board connected to a mother board by an electrical connector of the present invention.

FIG. 1 is a side view of the connector 10 of the present invention for making electrical connection between a daughter board 12 and a mother board 14. The connector 10 includes a connector housing 15 having a portion thereof broken away to expose a portion of the daughter board 12 therein. A slot 16 runs the length of the connector housing 15 and communicates with a plurality of chambers. The slot 16 extends partially through the connector housing 15 to top surface 19, leaving solid portions 22 between, and defining the ends of, the chambers 17. The top of the chambers 17 extend to surface 20 such that the edge of the daughter board 12 may be inserted into the top portion of the chambers 17 before further insertion is stopped by the top surface 19 of the solid portions 22. The solid portions 22 receive a plurality of screws 25 for connecting the mother board 14 to the connector housing 15, as will be explained.

Figure 2:
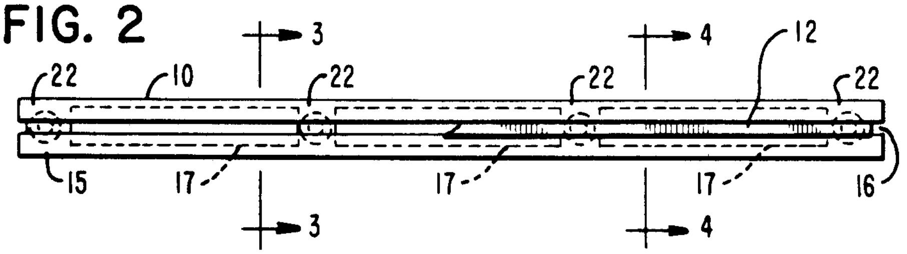
FIG. 2 is the top view of a housing member of the electrical connector of FIG. 1.

FIG. 2 is a top view of the connector housing 15, and shows the chambers 17 in phantom and the solid portions therebetween.

Figure 5:
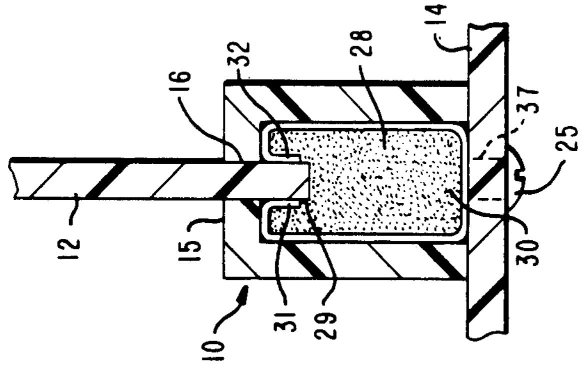
FIG. 5 is a cross sectional view of the electrical connector of the present invention engaged with the edge of a daughter board and fastened with a mother board for making electrical connections therebetween.
Figure 4:
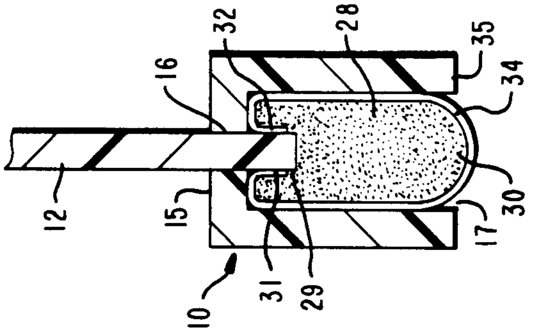
FIG. 4 is a cross sectional view of the electrical connector of the present invention engaged with the edge of a daughter board.
Figure 3:
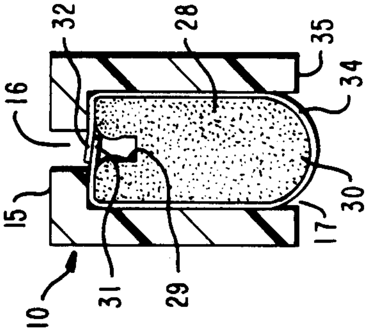
FIG. 3 is a cross sectional view of the electrical connector of the present invention.

FIGS. 3, 4 and 5 are cross sectional views of a portion of the connector assembly 10 showing how the connector assembly 10 may be assembled for making electrical connections between the daughter board 12 and mother board 14. The connector assembly 10 includes elastomeric members 28, each sized to be fitted into one of the chambers 17 of the connector housing 15. Each elastomeric member 28 has an upper slot 29 which communicates with the slot 16 in the connector housing 15. The lower portion 30 of each elastomeric member 28 is rounded and extends below the bottom 35 of the connector housing 15 such that the elastomeric members 28 will be compressed when the mother board 14 is fastened to the connector housing 15, as will be explained. The elastomeric members 28 may be fabricated of compressible silicone material available from the General Electric Company under the designation SE6140 and having a durometer rating of 40.

A commercially available flexible circuit 34 is positioned around the periphery of each elastomeric member 28 and trapped between the elastomeric member 28 and the walls of the chamber 17. Free-ends 31 and 32 of the flexible circuit 34 initially extend across the slot 29 of the elastomeric member 28.

FIG. 4 illustrates a daughter board 12 having one edge inserted into the slot 16 of the connector housing 15 and extending into the slot 29 of the elastomeric member 28. With the edge of the daughter board 12 in the slot 29, the free-ends 31 and 32 are displaced downwards and trapped between the sides of the daughter board 12 and the walls of the slot 29 as the daughter board 12 is inserted into the slot 29. It will be noted that the width of the slot 29 is at least ten per cent less than the thickness of the daughter board 12, such that as the edge of the daughter board 12 is inserted into the slot 29, the elastomeric material is compressed making a tight connection between the sides of the daughter board 12 and the free-ends 31 and 32. A wiping action is also provided as the edge of the daughter board 12 is inserted into the slot 29.

Referring to FIG. 5, the mother board 14 is connected to the housing member 15 by the plurality of screws 25 which pass through holes 37 in the mother board 14 and are screwed into the solid portions 22 of the housing member 15 (see FIGS. 1 and 2). As the mother board 14 is drawn into tight engagement with the connector housing 15, the lower portions 30 of the elastomeric members 28 are compressed, tightly trapping the flexible circuit 34 between the elastomeric members 28 and top of the mother board 14.

Figure 6:
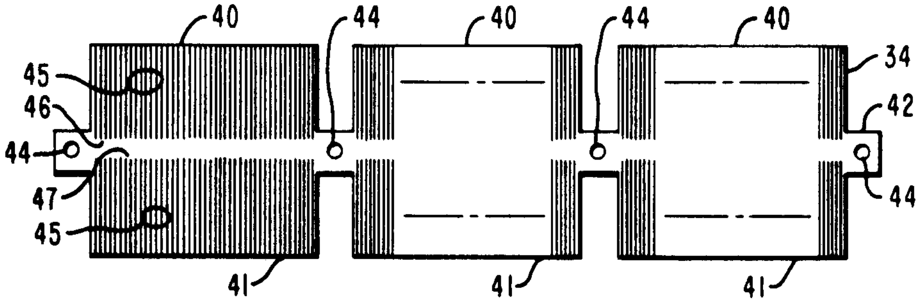
FIG. 6 is an elevational view of a flexible circuit of the connector of FIG. 1 wherein the flexible circuit has been rolled out flat.

FIG. 6 illustrates the flexible circuit 34 in a rolled-out-flat condition before it has been formed around the elastomeric members 28 (see FIGS. 3–5). The flexible circuit 34, which can be formed of polyimide or other similar material, has a number of opposed projections 40 and 41 extending from a central strip 42. The projections 40 and 41 are sized such that, when they are positioned around opposite sides of individual elastomeric members 28, the projections 40 and 41, and associated elastomeric members 28, will fit into the chambers 17 of the connector housing 15 (see FIGS. 1 and 2). The center strip 42 includes holes 44 located on its ends and along its length between the pairs of projections 40 and 41 for registering with the holes 37 through the mother board 14. It will thus be understood that the screws 25 pass through the holes 37 and 44 into the solid portions 22 of the connector housing 15 when the mother board 14 is fastened to the connector housing 15, as described in connection with FIG. 5. The flexible circuit 34 has etched, gold plated copper conductors 45 on the projections 40 and 41 extending partially into the connecting strip 42 and ending at reference numbers 46 and 47. This allows a separate circuit on each side of the daughter board 12 to be connected to a separate circuit on the mother board 14, as will be discussed in connection with FIG. 7. It will be understood that individual flexible circuits having paired projections 40 and 41 may be used for placing around each elastomeric member 28 for ease of assembly, if desired.

Figure 7:
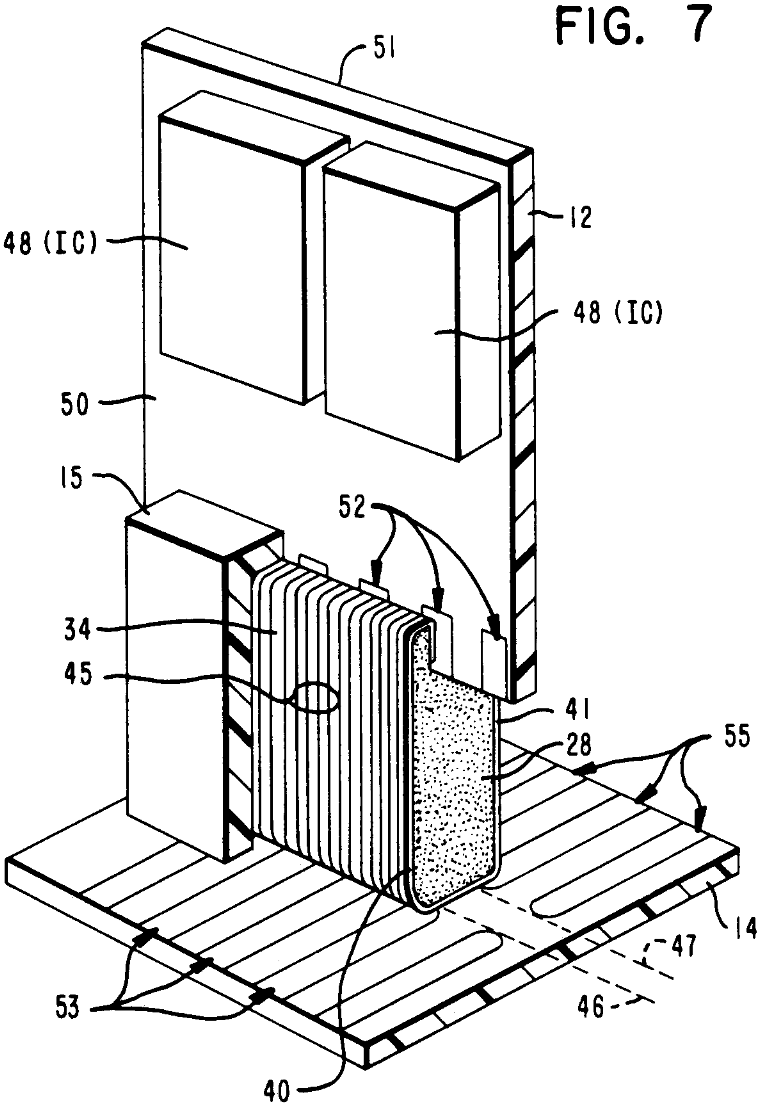
FIG. 7 is a perspective view of a daughter board connected to a mother board by an electrical connector of the present invention wherein portions of the electrical connector have been broken away to show its internal construction.

FIG. 7 is a perspective view of the connector 10 of the present invention with the housing 15 broken away to show the electrical connections between edge connector pads 52 leading to electronic components, such as integrated circuits (IC) 48 on the daughter board 12, with printed circuit connector pads 53 and 55 on the mother board 14. The daughter board 12 has a first side 50 and a second side 51, each having separate edge connector pads 52 thereon. The mother board 14 may include two separate printed circuits, each having separate connector pads 53 and 55, respectively, as desired. In the illustrated embodiment of FIG. 7, the edge connector pads 52 of the circuit on side 50 of the daughter board 12 are connected to the connector pads 53, and separate edge connector pads on side 51 (not shown) are connected to the connector pads 55. As discussed in connection with FIG. 6, the flexible circuit 34 around the elastomeric members 28 includes gold plated conductors 45 on each of the extensions 40 and 41. The conductors 45 may be interrupted at lines 46 and 47 such that there is no electrical continuity between the conductors 45 on extensions 40 and 41 of the flexible circuit 34. The edge connector pads 52 and the printed circuit connector pads 53 and 55 are 0.050 inches wide on 0.100 inch center-to-center spacing. The gold plated conductors 45 on the flexible circuit 34 are 0.010 inches wide on 0.020 inch center-to-center spacing. Thus, as shown in FIG. 7, at least two of the conductors 45 lead from each of the edge connector pads 52 to the connector pads 53 and 55 which are to be electrically connected.

It will be understood that if printed circuits are printed on both sides of the mother board 14, a connector assembly 10 may be attached to both sides of the mother board 14 to provide for the connection of a daughter boards 12 on each side of the mother board 14, if desired.

It will be seen that the connector assembly 10 of the present invention is inexpensive in that pins and pin connections are not required, that electrical connections will be made even if the connector assembly 10 or the flexible circuit 34 therein are slightly skewed or offset. The connector assembly 10 also provides for right angle contact between a mother board 14 and daughter board 12, does not require expensive, often unused, mating connectors on a mother board, allows for right angle contact between two circuits on the mother board 14 with two circuits on the daughter board 12, allows for the changing of the daughter board 12 without removal of the connector assembly 10, and provides for ease of interconnect changes by revising the flexible circuit conductor pattern. It will also be understood that the connector assembly 10 does not have to be added to the mother board 14 until it is desired to add a daughter board 12. Thus, the connector assembly 10 does not have to be added to the mother board 14 in anticipation of additional daughter boards 12 (such as additional memory boards) being added at a later time, but may be quickly and easily added with only a screwdriver at the time additional daughter boards 12 are actually added.

Thus, a connector has been described which provides the aforementioned objects. It will be understood by those skilled in the art that the disclosed embodiment is exemplary only, and that the various elements disclosed may be replaced by equivalents without departing from the invention hereof, which equivalents are intended to be covered by the appended claims.

I claim:

1. A right angle connector for connecting a mother board to a daughter board comprising:

a housing defining a chamber and having a first slot therein communicating with said chamber;

an elastomeric member, having a second slot therein in register with said first slot, disposed in said chamber and having a portion extending out of said chamber; and flexible circuit means folded around said elastomeric member having its free ends located in said second slot; such that, electrical contact is made between edge connector pads on the daughter board inserted into said first and second slots and the conductors on said flexible circuit, and electrical contact is made between connector pads of the mother board and a portion of said flexible circuit surrounding said extending portion of said elastomeric member extending from the housing as said housing is fastened to the mother board compressing said elastomeric member making a tight engagement therebetween.

2. A right angle connector as set forth in claim 1, wherein electrical contact with each connector pad of said daughter board and with each connector pad of said mother board is made by at least two conductors of said flexible circuit.

3. A right angle connector as set forth in claim 2, wherein:

said housing has means for receiving a fastener;

said flexible circuit has a hole therein for allowing the passage of a fastener to said fastener receiving means; and the mother board has a hole therein for allowing the passage of said fastener to said fastener receiving means enabling the right angle connector to be fastened onto the mother board for connection to the daughter board.

4. A right angle connector as set forth in claim 3, wherein:

the right angle connector and the daughter board are added to the mother board as part of an expansion of capabilities.

5. A dual right angle connector for connecting a mother board to a first and a second daughter board on a first and a second opposite surface of the mother board respectively, comprising:

a first housing defining a first chamber and having a first slot therein communicating with said first chamber;

a second housing defining a second chamber and having a second slot therein communicating with said second chamber;

a first elastomeric member, having a third slot therein in register with said first slot, disposed in said first chamber and having a first portion extending out of said first chamber;

a second elastomeric member, having a fourth slot therein in register with said second slot, disposed in said second chamber and having a second portion extending out of said second chamber;

first flexible circuit means folded around the first elastomeric member having its free ends located in said third slot; such that, electrical contact is made between edge connector pads on the first daughter board inserted into said first and third slots and the conductors on said first flexible circuit, and electrical contact is made between connector pads on the first surface of the mother board and a first portion of said first flexible circuit surrounding said first portion of said first elastomeric member extending from the first housing as said first housing is fastened to the first surface of the mother board compressing said first elastomeric member making a tight engagement therebetween; and second flexible circuit means folded around the second elastomeric member having its free ends located in said fourth slot; such that, electrical contact is made between edge connector pads on the second daughter board inserted into said second and fourth slots and the conductors on said second flexible circuit, and electrical contact is made between connector pads on the second surface of the mother board and a second portion of said second flexible circuit surrounding said second portion of said second elastomeric member extending from the second housing as said second housing is fastened to the second surface of the mother board compressing said second elastomeric member making a tight engagement therebetween.

6. A dual right angle connector as set forth in claim 5, wherein:

said first and second housings have means for receiving a fastener, respectively;

said first and second flexible circuits have a hole therein for allowing the passage of a fastener to each fastener receiving means, respectively; and the mother board has a hole therein for allowing the passage of each fastener to each fastener receiving means enabling the first and second right angle connectors to be fastened to an opposite surface of the mother board to connect the first and second oppositely located daughter boards.

7. A dual right angle connector as set forth in claim 6, wherein said first and second fastener receiving means, said first and second flexible circuit holes, and said hole in the mother board are aligned to allow fastening by the same fastener.

8. A dual right angle connector as set forth in claim 6, wherein:

the right angle connectors and the daughter boards are added to the mother board as part of an expansion of capabilities.

9. A right angle connector for connecting a mother board to a daughter board comprising:

a housing having a top surface and two side surfaces defining a chamber, said top surface having a first slot therein communicating with said chamber;

an elastomeric member, having a second slot therein in register with said first slot, disposed in said chamber and having a portion extending out of said chamber; and flexible circuit means folded around said elastomeric member having its free ends located in said second slot; such that, electrical contact is made between edge connector pads on the daughter board inserted into said first and second slots and the conductors on said flexible circuit, and electrical contact is made between connector pads of the mother board and a portion of said flexible circuit surrounding said portion of said elastomeric member extending from the housing as said housing is fastened to the mother board compressing said elastomeric member within said chamber making a tight engagement between said daughter board, said flexible circuit and said mother board.

* * * * *